United States Patent
Kyung et al.

[11] Patent Number: 6,072,846
[45] Date of Patent: Jun. 6, 2000

[54] METHOD AND APPARATUS FOR DISTRIBUTING A CLOCK SIGNAL TO SYNCHRONOUS MEMORY ELEMENTS

[75] Inventors: Gye-Hyun Kyung, Suwon; Chul-Soo Kim, Kyungki-do, both of Rep. of Korea

[73] Assignee: Samsung Electronics, Co., Ltd., Suwon, Rep. of Korea

[21] Appl. No.: 08/896,788

[22] Filed: Jul. 18, 1997

[30] Foreign Application Priority Data

Jul. 22, 1996 [KR] Rep. of Korea ............... 96-29638

[51] Int. Cl.[7] .................... H04L 7/00; H03K 5/13
[52] U.S. Cl. .................... 375/354; 375/373; 327/149; 327/153
[58] Field of Search ...................... 375/354, 356, 375/373, 376; 327/147, 148, 149, 153, 158, 161; 713/401

[56] References Cited

U.S. PATENT DOCUMENTS

| | | | |
|---|---|---|---|
| 4,488,252 | 12/1984 | Vassar | 364/748.11 |
| 4,811,268 | 3/1989 | Nishitani et al. | 364/745.03 |
| 4,817,047 | 3/1989 | Nishitani et al. | 364/754.03 |
| 4,884,232 | 11/1989 | Schlunt | 364/750.5 |
| 4,939,684 | 7/1990 | Gehrig et al. | 364/724.013 |
| 5,087,829 | 2/1992 | Ishibashi et al. | 327/152 |
| 5,220,670 | 6/1993 | Arakawa et al. | 395/564 |
| 5,307,381 | 4/1994 | Ahuja | 375/356 |
| 5,517,436 | 5/1996 | Andreas et al. | 364/736.04 |
| 5,555,202 | 9/1996 | Chu | 364/715.08 |
| 5,744,991 | 4/1998 | Jefferson et al. | 327/158 |
| 5,777,501 | 7/1998 | AbouSeido | 327/274 |
| 5,815,016 | 9/1998 | Erickson | 327/158 |
| 5,828,257 | 10/1998 | Masleid | 327/276 |

*Primary Examiner*—Young T. Tse
*Attorney, Agent, or Firm*—Marger Johnson & McCollom, P.C.

[57] ABSTRACT

A clock supply device for distributing a source clock signal to memory elements in a synchronous memory system reduces skew and improves accuracy by transmitting a first clock signal from a synchronization section located at a first position to a clock distribution section located at a second position and then feeding back a second clock signal to the synchronization section which includes a phase locked loop or delay locked loop. The synchronization section locks the first signal with the source clock signal, thereby controlling the skew between the first clock signal and the source clock signal. The clock distributing section distributes the first clock signal to memory elements and generates the second clock signal as a feedback signal responsive to the first clock signal. The clock supply device includes a first transmission line for transmitting the first clock signal from the first position to the second position, and a second transmission line for transmitting the second clock signal back to the first position. A third transmission line is optionally provided to transmit the source clock signal from a clock generating section located at a third position to the synchronization section at the first position. The signal delay characteristics of the second and third transmission lines are preferably equal.

10 Claims, 2 Drawing Sheets

METHOD AND APPARATUS FOR DISTRIBUTING A CLOCK SIGNAL TO SYNCHRONOUS MEMORY ELEMENTS

This application corresponds to Korean patent application No. 96-29638 filed Jul. 22, 1996 in the name of Samsung Electronics Co., Ltd. which is herein incorporated by reference for all purposes.

BACKGROUND OF THE INVENTION

1. Field of the Invention

This invention relates generally to clock supply devices and more particularly to a method and apparatus for reducing the skew of a clock signal that is distributed to memory elements in a synchronous memory device.

2. Description of the Related Art

In a conventional clock supply device for a memory chip, a TTL level clock signal is provided from the system, received inside a memory chip, converted to a CMOS level after passing through a buffer, and then used for the clock signal of the memory. Thus, the conventional clock supply device has a prescribed signal delay characteristic between the point where the source clock signal is received from the system and the point where it is distributed and switched to internal elements of the memory.

In a synchronous memory device, which operates in synchronization with the clock signal that is input from the system, the clock supply device employs a built-in delay locked loop (DLL) or phase locked loop (PLL) circuit to accurately supply the system clock signal to the internal elements of the memory.

FIG. 1 is a block diagram of a prior art clock supply device which utilizes a DLL circuit for distributing a system clock signal to the internal elements of a memory device. Referring to FIG. 1, the conventional clock supply device includes a clock generating section 10, which is located at a first position inside the memory, for generating a clock signal for the system. A clock distributing section 20, which is located at a second position inside the memory, distributes the clock signal. A DLL 14 produces a clock signal which is locked with the system clock signal that is generated by the clock generating section 10. A clock transmitting section 18 transmits the clock signal from the DLL 14 to the clock distributing section 20 with a prescribed signal delay characteristic. A clock transmission compensating section 16 compensates for the signal delay characteristic of the clock signal transmitted through the clock transmitting section 18 (typically a transmission line).

In a conventional clock supply device as constructed above, the source clock signal for the system is generated by the clock generating section 10 which is placed at the first position inside the memory.

The source clock signal is applied to the DLL 14, and the delayed clock signal is detected by a phase discriminator 11. The clock delay detected by the phase discriminator 11 is controlled by a charging pump 12. A delay cell 13 varies the clock delay controlled by the charging pump 12 so that the clock delay is locked with the source clock signal.

Although the clock signal provided by the DLL 14 is locked with the source signal, a prescribed signal delay occurs while the clock signal is transmitted through a bus line to the clock distributing section 20 which is located at the second position inside the memory. Therefore, to compensate for the prescribed clock delay which occurs when the clock signal is propagated through the clock transmitting section 18, the clock signal which is output from the DLL 14 is fed back to the DLL through the clock transmission compensating section 16 which compensates for the prescribed clock delay. The clock signal from the DLL 14 is locked with the source clock signal, and is then output to the clock distributing section 20.

FIG. 2 is a block diagram of a second prior art clock supply device which utilizes a PLL circuit for distributing a clock signal to the internal elements of a memory system. Referring to FIG. 2, the conventional clock supply device includes a clock generating section 22, which is located at a first position inside the memory, for generating a clock signal for the system. A clock distributing section 32, which is located at a second position inside the memory, distributes the clock signal. A PLL 26 produces a clock signal which is locked with the phase of the system clock signal that is generated by the clock generating section 22. A clock transmitting section 30 (typically a transmission line) transmits the clock signal from the PLL 26 to the clock distributing section 32 with a prescribed signal delay characteristic. A clock transmission compensating section 28 compensates for the signal delay characteristic of the clock signal transmitted through the clock transmitting section 30.

The operation of the clock supply device of FIG. 2 is similar to that of the device of FIG. 1 even though the DLL is replaced by a PLL. Thus a more detailed explanation of the operation of the device of FIG. 2 will be omitted.

In the prior art clock supply devices of FIGS. 1 and 2 as described above, the operation characteristics of the clock transmission compensating sections 16 and 28 are sensitive to variations in the external environment, process, temperature, etc. The operating characteristics of the clock transmitting sections 18 and 30 are also sensitive to such changes, and thus it is difficult for the circuits to lock the clock signals from the clock distributing sections 20 and 32 with the source clock signals from the clock generating sections 10 and 22.

Thus, since the skew of the clock signal is likely to change along the bus lines between the points at which the source clock signal is received from the system and the point at which it is applied and switched to the internal elements of the memory, the phase of the source clock signal is not accurately synchronized with the internal elements of the memory. This results in the generation of undesirable jitter.

Accordingly, a need remains for a technique for overcoming the problems of the prior art.

SUMMARY OF THE INVENTION

Therefore, it is an object of the present invention to reduce the skew of a clock signal that is distributed from a first position to a second position that is spaced apart from the first position.

Another object of the present invention is to reduce the mismatch of operating commands among memory elements in a memory system.

A further object of the present invention is provide an improved technique for distributing a clock signal to system elements.

To accomplish these and other objects, a clock supply device constructed in accordance with the present invention reduces skew and improves accuracy by transmitting a first clock signal from a synchronization section located at a first position to a clock distribution section located at a second position spaced apart from the first position, and then transmitting a feedback clock signal back to the first position through a transmission line having a known delay characteristic. The first clock signal is distributed to other circuit elements at the second position. Since the delay characteristic of the feedback transmission line is known, the first clock signal can be generated with a synchronization element such as a phase locked loop or a delay locked loop which locks the first clock signal with a source clock signal and compensates for the delay in transmitting the first clock signal to the second position. The use of a feedback clock signal reduces the sensitivity of the clock supply device to variations in temperature, environment, process, etc.

One aspect of the present invention is a method for distributing a source clock signal comprising: generating a first clock signal responsive to the source clock signal at a first position; transmitting the first clock signal to a second position spaced apart from the first position; generating a second clock signal responsive, to the first clock signal at the second position; feeding back the second clock signal to the first position; and locking the second clock signal with the source clock signal, thereby controlling the skew between the second clock signal and the source clock signal.

Feeding the second clock signal back to the first position can include transmitting the second clock signal with a predetermined delay, while transmitting the first clock signal to the second position can also include transmitting the first clock signal with a predetermined delay. The method further includes distributing the first clock signal at the second position.

Another aspect of the present invention is a clock supply device comprising: a synchronization section located at a first position for generating a first clock signal responsive to a source clock signal; a first transmission line coupled between the first position and a second position for transmitting the first clock signal to the second position, the second position being spaced apart from the first position; a clock distributing section located at the second position for distributing the first clock signal and generating a second clock signal responsive to the first clock signal; and a second transmission line coupled between the second position and the first position for transmitting the second clock signal to the synchronization section.

The device can further include a third transmission line coupled between the first position and a second position for transmitting the source clock signal to the synchronization section and a clock generating section located at the third position. In a preferred embodiment, the delay characteristics of the first and third transmission lines are the same or similar. The synchronization section can include a phase locked loop or a delay locked loop.

A further aspect of the present invention is a clock supply circuit for a semiconductor memory device comprising: means for transmitting a first clock signal from a first position to a second position spaced apart from the first position; means for distributing the first clock signal to at least one memory element at the second position and generating a second clock signal responsive to the first clock signal; means for transmitting the second clock signal from the second position to the first position; and synchronization means located a the first position for generating the first clock signal responsive to a source clock signal and locking the phase of the second clock signal with the phase of the source clock signal.

The circuit can further include means for transmitting the source clock signal from a third position spaced apart from the first position to the first position and means located at the third position for generating the source clock signal.

An advantage of the present invention is that it reduces clock skew in a clock supply device.

Another advantage of the present invention is that it reduces the sensitivity of a clock supply device to variations in environment, temperature, and processing.

The foregoing and other objects, features and advantages of the invention will become more readily apparent from the following detailed description of a preferred embodiment of the invention which proceeds with reference to the accompanying drawings.

DETAILED DESCRIPTION

Figure 1:
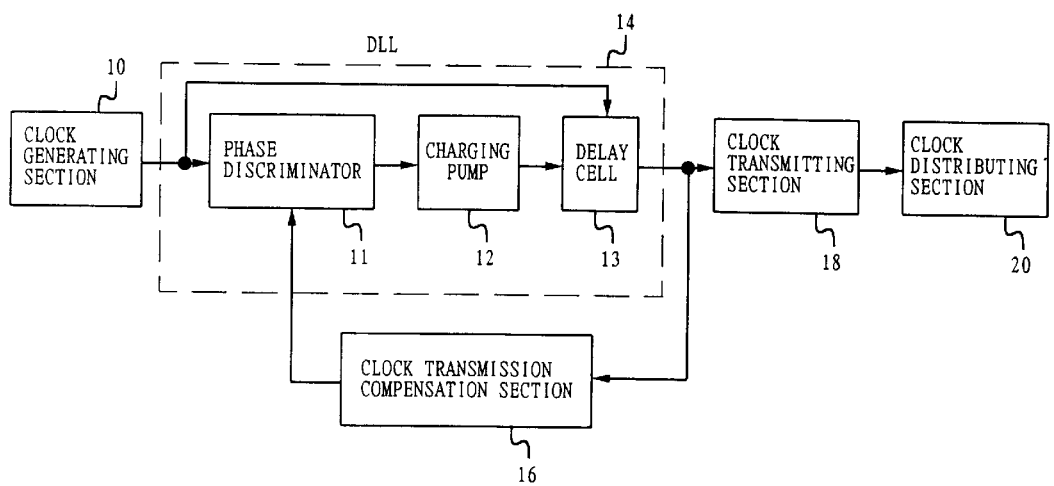
FIG. 1 is block diagram of a prior art clock supply device.
Figure 2:
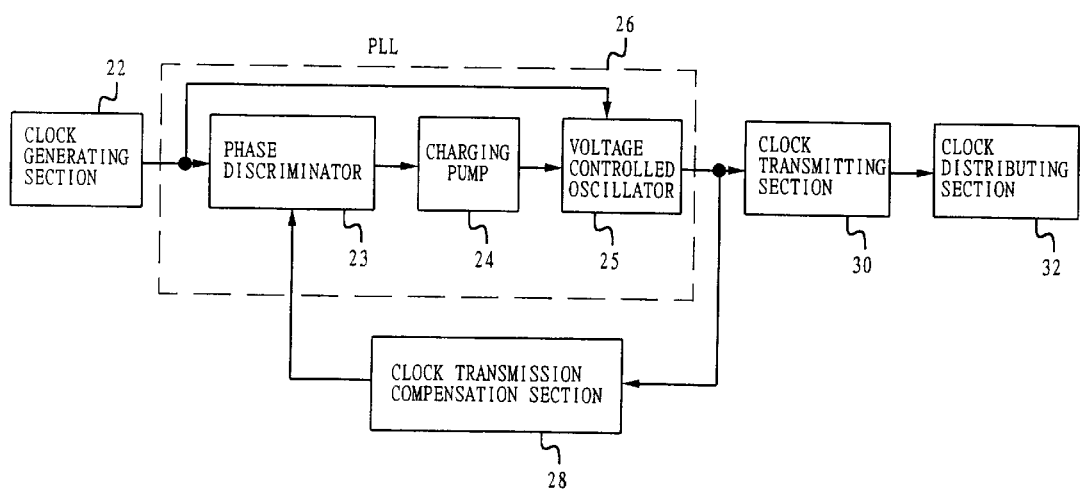
FIG. 2 is block diagram of a second prior art clock supply device.
Figure 3:
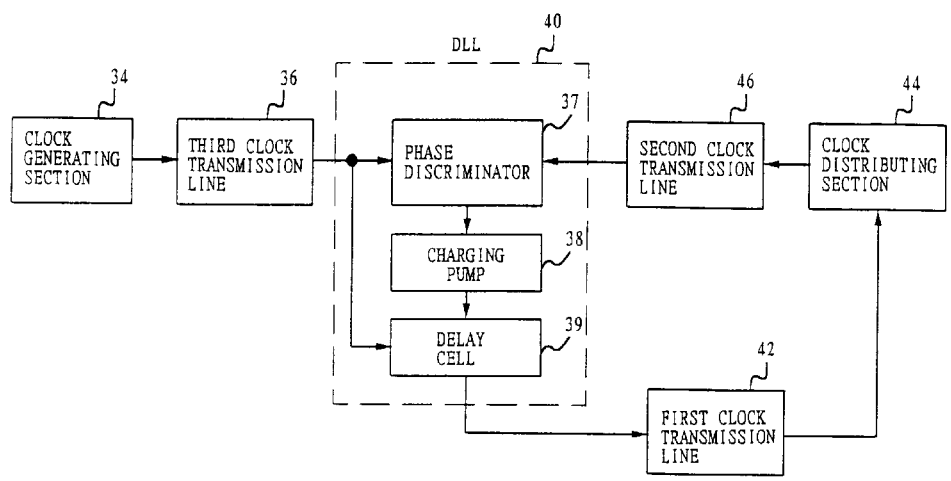
FIG. 3 is a block diagram of a first embodiment of a clock supply device constructed in accordance with the present invention.

FIG. 3 is a block diagram of a first embodiment of a clock supply device constructed in accordance with the present invention for distributing a clock signal to the internal memory elements of a memory system. The clock supply device of FIG. 3 includes a delay locked loop (DLL) 40 which is located at a first position, a clock distributing section 44 which is located at a second position, a clock generating section 34 which is located at a third position, a first clock transmission line 42 which is coupled between the first position and the second position, a second clock transmission line 46 which is coupled between the second position and the first position, and a third clock transmission line 36 which is coupled between the first position and the third position.

The first clock transmission line 42 has a predetermined signal delay characteristic for transmitting a first clock signal from the DLL 40 to the clock distributing section 44. The second clock transmission line 46 also has a predetermined signal delay characteristic for transmitting a second clock signal to the first position intermediate the clock generating section 34 and the clock distributing section 44. The third clock transmission line 36 has a predetermined signal delay characteristic which is identical to that of the second clock transmission line 46.

In operation, the clock generating section 34, which is located at the third position, generates a source clock signal which is transmitted to the DLL through the third clock transmission line. The DLL 40, which is located at the first position intermediate the clock generating section 34 and the clock distributing section 44, generates the first clock signal which is locked with the phase of a the source clock signal. The clock distributing section 44, which is located at the second position, distributes the first clock signal to memory elements and generates the second clock signal as a feedback signal responsive to the first clock signal. The second clock signal is transmitted back to the DLL through the second clock transmission line 46.

The operation of the clock supply device of FIG. 3 will now be explained in more detail. The system source clock signal is generated by the clock generating section 34 and is transmitted to the DLL 40 through the third clock transmission line 36 with a predetermined clock delay. The phase of the clock signal having the predetermined clock delay is detected by a phase discriminator 37. The detected phase of the clock signal is controlled by a charging pump 38 and then locked with the source clock signal by a delay cell 39 so that the delay cell 39 produces the first clock signal.

Thereafter, the first clock signal is transmitted to the clock distributing section 44, which is located at the second position inside the memory, through the first clock transmission line 42 with a predetermine time delay. Then, the first clock signal is distributed and supplied to the respective memory elements through the clock distributing section 44 which has multiple outputs.

Since the positions of the respective memory elements are different from one another, the corresponding clock delays of the first clock signal, which is supplied and switched to the respective memory elements, are also different from one another. Accordingly, the second clock signal, which is generated by feeding back the output of the clock distributing section 44, is transmitted to the DLL 40 with a predetermined clock delay that is identical to that of the third clock transmission line 36. Then, the second clock signal, which compensates for the predetermined clock delay generated among the memory elements, is feed back to the DLL 40 through the second clock transmission line 46 and locked with the first clock signal.

Figure 4:
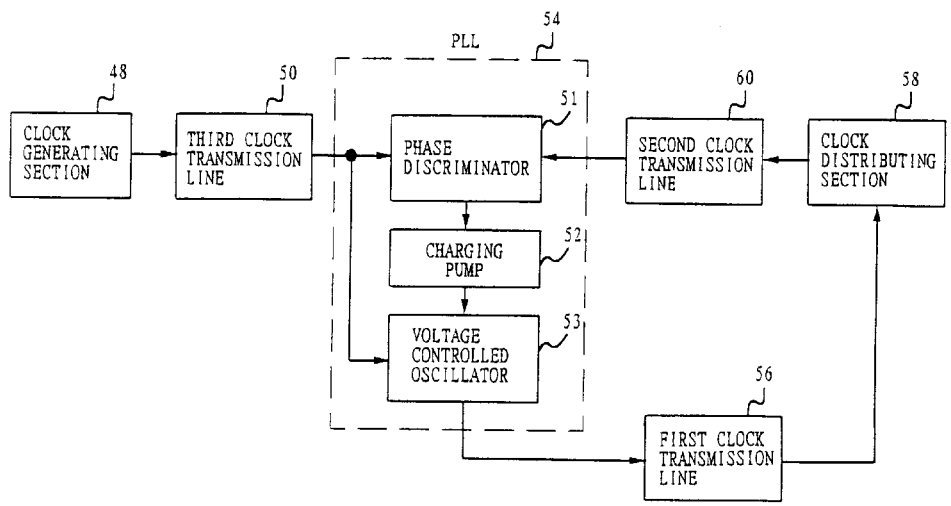
FIG. 4 is a block diagram of a second embodiment of a clock supply device constructed in accordance with the present invention.

FIG. 4 is a block diagram of a second embodiment of a clock supply device constructed in accordance with the present invention for distributing a clock signal to the internal memory elements of a memory system. The clock supply device of FIG. 4 includes a phase locked loop (PLL) 54 which is located at a first position, a clock distributing section 58 which is located at a second position, a clock generating section 48, which is located at a third position, a first clock transmission line 56 which is coupled between the first position and the second position, a second clock transmission line 60 which is coupled between the second position and the first position, and a third clock transmission line 50 which is coupled between the first position and the third position.

The first clock transmission line 56 has a predetermined signal delay characteristic for transmitting a first clock signal from the PLL 54 to the clock distributing section 58. The second clock transmission line 60 also has a predetermined signal delay characteristic for transmitting a second clock signal from the second position to the first position intermediate the clock generating section 48 and the clock distributing section 58. The third clock transmission line 50 has a predetermined signal delay characteristic which is identical to that of the second clock transmission line 60.

In operation, the clock generating section 48, which is located at the third position, generates a source clock signal which is transmitted to the PLL through the third clock transmission line 50. the PLL, which is located at the first position intermediate the clock generating section 48 and the clock distributing section 58, generates the first clock signal which is locked with the frequency of the source clock signal. The clock distributing section 58, which is located at the second position, distributes the first clock signal to memory elements and generates the second clock signal as a feedback signal responsive to the first clock signal. The second clock signal is transmitted back to the PLL through the second clock transmission line 60.

The operation of the clock supply device of FIG. 4 will now be explained in more detail. The system source clock signal is generated by the clock generating section 48 and is transmitted to the PLL 54 through the third clock transmission line 50 with a predetermined clock delay. The phase of the clock signal having the predetermined clock delay is detected by a phase discriminator 51. The detected phase of the clock signal is controlled by a charging pump 52 and then locked with the source clock signal by a voltage controlled oscillator 53, which varies the oscillation frequency for locking the phase delay with the source clock signal. Thus, that the first clock signal, which is locked with the source clock signal, is generated by the voltage controlled oscillator.

Thereafter, the first clock signal is transmitted to the clock distributing section 58, which is located at the second position inside the memory, through the first clock transmission line 56 with a predetermined phase delay. Then, the first clock signal is distributed and supplied to the respective memory elements through the clock distributing section 58.

Since the positions of the respective memory elements are different from one another, the corresponding clock delays of the first clock signal, which is supplied and switched to the respective memory elements, are also different from one another. Accordingly, the second clock signal, which is generated by feeding back the output of the clock distributing section 58, is transmitted to the PLL 54 with a predetermined clock delay that is identical to that of the third clock transmission line 50. Thus, the second clock signal, which compensates for the predetermined clock delay, is locked with the first clock signal.

Since the DLL 40 and the PLL 54 of the embodiments described above are located at a position intermediate the clock generating sections 34 and 48 and the clock distributing sections 44 and 58, respectively, the clock propagation delay from the third clock transmission lines 36 and 50 and the second clock transmission lines 46 and 60 have the same value. This reduces the skew width between the source clock signal and the clock signal output from the clock distributing sections 44 and 58.

An advantage of a clock supply device constructed according to the present invention is that it reduces the skew of the clock signal, and thus, supplies an accurate clock signal. A clock supply device constructed according to the present invention is particularly suited for application in a synchronous memory device which operates in synchronization with a clock signal to perform high speed commands.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A method for distributing a source clock signal comprising:

transmitting the source clock signal from a third position to a first position spaced apart from the third position with a first transmission line having a first delay;

generating a first clock signal responsive to the source clock signal at the first position;

transmitting the first clock signal to a second position spaced apart from the first position;

generating a second clock signal responsive to the first clock signal at the second position;

feeding back the second clock signal to the first position with a second transmission line having a second delay; and locking the second clock signal with the source clock signal, thereby controlling the skew between the second clock signal and the source clock signal;

wherein the first position is located intermediate the third position and the second position; and wherein the delay characteristics of the first delay is similar to the second delay.

2. A method according to claim 1 further including distributing the first clock signal at the second position.

3. A clock supply device comprising:

a synchronization section located at a first position for generating a first clock signal responsive to a source clock signal;

a third transmission line coupled between a third position and the first position for transmitting the source clock signal to the synchronization section;

a first transmission line coupled between the first position and a second position for transmitting the first clock signal to the second position, the second position being spaced apart from the first position;

a clock distributing section located at the second position for distributing the first clock signal and generating a second clock signal responsive to the first clock signal; and a second transmission line coupled between the second position and the first position for transmitting the second clock signal to the synchronization section;

wherein the first position is located intermediate the third position and the second position; and wherein the delay characteristics of the second and third transmission lines are similar.

4. A clock supply device according to claim 3 further including a clock generating section located at the third position.

5. A clock supply device according to claim 3 wherein the synchronization section includes a phase locked loop.

6. A clock supply device according to claim 3 wherein the synchronization section includes a delay locked loop.

7. A clock supply circuit comprising:

means for transmitting a first clock signal from a first position to a second position spaced apart from the first position;

means for distributing the first clock signal to at least one memory element at the second position and generating a second clock signal responsive to the first clock signal;

a first transmission line for transmitting the second clock signal from the second position to the first position;

a second transmission line for transmitting a source clock signal from a third position to the first position, the third position being spaced apart from the first position; and synchronization means located at the first position for generating the first clock signal responsive to the source clock signal and locking the phase of the second clock signal with the phase of the source clock signal;

wherein the first position is located intermediate the third position and the second position; and wherein the first and second transmission lines have similar delay characteristics.

8. A clock supply circuit according to claim 7 further including means located at the third position for generating the source clock signal.

9. A clock supply circuit according to claim 7 wherein the synchronization means includes a phase locked loop.

10. A clock supply circuit according to claim 7 wherein the synchronization means includes a delay locked loop.

* * * * *